US007522409B2

(12) United States Patent
Lin et al.

(10) Patent No.: US 7,522,409 B2
(45) Date of Patent: Apr. 21, 2009

(54) POSITIONING MECHANISM

(75) Inventors: Hsien-Yuan Lin, Taipei (TW); Ming-Jen Yu, Taipei (TW); Chih-Wei Chang, Taipei (TW); Yeh-Cheng Tan, Taipei (TW)

(73) Assignee: Hewlett-Packard Development Company, L.P., Houston, TX (US)

( * ) Notice: Subject to any disclaimer, the term of this patent is extended or adjusted under 35 U.S.C. 154(b) by 490 days.

(21) Appl. No.: 11/240,423

(22) Filed: Sep. 30, 2005

(65) Prior Publication Data

US 2006/0073720 A1 Apr. 6, 2006

(30) Foreign Application Priority Data

Oct. 4, 2004 (TW) .............................. 93129968 A
Nov. 4, 2004 (CN) ........................ 2004 1 0087165

(51) Int. Cl.
*H05K 7/12* (2006.01)

(52) U.S. Cl. ........................ 361/683; 361/727; 439/151

(58) Field of Classification Search ................. 361/683, 361/727; 439/151
See application file for complete search history.

(56) References Cited

U.S. PATENT DOCUMENTS

| | | | | |
|---|---|---|---|---|
| 5,499,925 | A * | 3/1996 | Lwee | 439/157 |
| 6,315,583 | B1 * | 11/2001 | Nishioka | 439/131 |
| 6,980,428 | B2 * | 12/2005 | Ting | 361/685 |
| 6,986,675 | B2 * | 1/2006 | Takada | 439/159 |
| 7,008,245 | B1 * | 3/2006 | Chien | 439/159 |
| 2005/0070142 | A1 * | 3/2005 | Hanzawa et al. | 439/159 |

* cited by examiner

*Primary Examiner*—Lisa Lea-Edmonds
*Assistant Examiner*—Ingrid Wright

(57) ABSTRACT

A positioning mechanism comprises a slide base, a rotation arm and an elastic member. The slide base is disposed over a bottom surface of a second device and is slidable in first and second sliding directions. The sliding base has a track defining a closed sliding path that comprises a first positioning point, a first release point, a second positioning point, and second release point. The rotation arm comprises first and second ends, the first end being disposed on the bottom surface around a pivot, and the second end having a slide member capable of being positioned at the first positioning point or the second positioning point along the sliding path of the track. The elastic member is provided on the bottom surface and is configured to cause the second end of the rotation arm to rotate and to cause the slide base to slide.

21 Claims, 6 Drawing Sheets

POSITIONING MECHANISM

CROSS REFERENCE TO RELATED APPLICATION

This application claims priority to and incorporates by reference Taiwanese patent application number 93129968, filed Oct. 4, 2004. and Chinese patent application number 200410087165.3, filed Nov. 4, 2004.

BACKGROUND

Many portable devices, such as notebook computers, have connectors on an exterior surface of the device to permit connection to other devices. For example, a notebook computer may have one or more Universal Serial Bus (USB) connectors on one or more of its side surfaces to permit connection of the notebook computer to a USB-compatible peripheral device. An example of such a peripheral device includes a memory device containing, for example, non-volatile memory. A peripheral device that is connected to a notebook computer typically protrudes away from the computer, thereby representing the possibility of being inadvertently hit as the computer is transported from one location to another. Hitting the peripheral device may cause the peripheral device to undesirably become disconnected from the computer or, worse, may cause damage to the peripheral device or computer. Accordingly, a user of the portable computer must be careful when transporting the computer that has a peripheral device connected thereto.

BRIEF DESCRIPTION OF THE DRAWINGS

For a detailed description of exemplary embodiments of the invention, reference will now be made to the accompanying drawings in which.

DETAILED DESCRIPTION

Figure 1A:
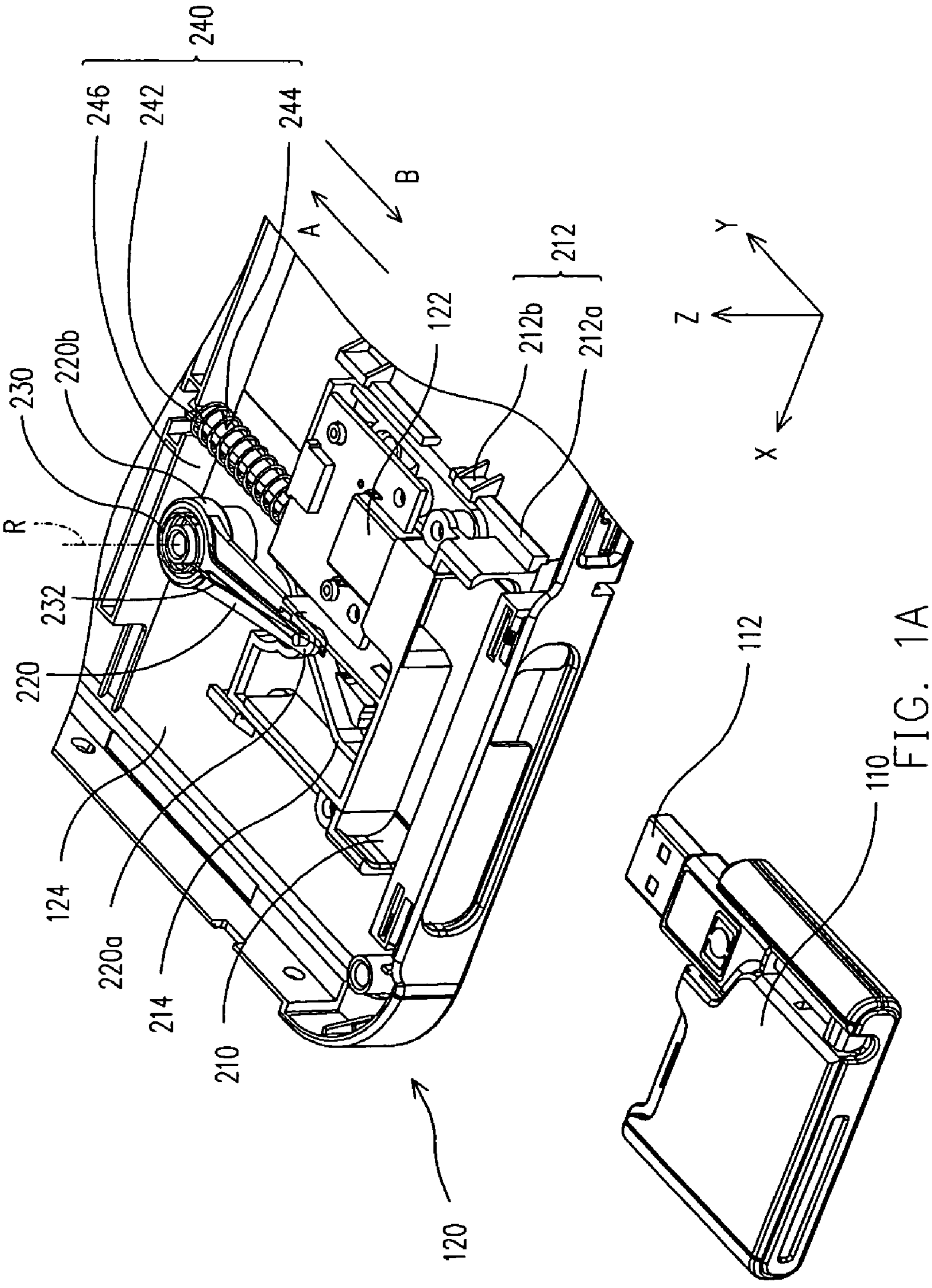
FIG. 1A is a perspective view showing a positioning mechanism according to various embodiments of the present invention.

FIGS. 1A, 1B and 2A-2D show a positioning mechanism in accordance with embodiments of the invention for use with an electronic device 120. The electronic device 120 is referred to herein as a “second” device. The positioning mechanism is used for positioning a first device 110 at first and second positions relative to the second device 120. First device 110 comprises a connector 112 and second device 120 comprises a mating connector 122. The positioning mechanism comprises a “push-push” mechanism whereby the first device 110 can be inserted into the second device 120 by application of a first force by a user to the first device thereby mating connectors 112 and 122. The connectors 112 and 122 can then be disconnected thereby permitting the first device 110 to be removed from the second device 120 by application of a second force to the first device 110. The first device 110 is thus pushed into the second device 120 to establish electrical and mechanical connection between the devices 110 and 120. When the user desires to remove the first device 110, the user again presses the first device causing it to be disconnected from the second device. Moreover, inserting and removing the first device 110 involves the user simply pressing on the first device; no separate user-contacted eject member (e.g., button, lever, etc.) is used. The positioning mechanism thus receives a first device into a second device. The first device is user-pushable into the second device during installation of the first device in the second device and again user-pushable while releasing the first device from the second device.

The first device 110 comprises various components contained within an enclosure while the second device 120 also comprises various components contained within an enclosure. The enclosure of the first device 110 fits partially or completely within the enclosure of the second device 120. In those embodiments in which the enclosure of the first device 110 fits completely within the enclosure of the second device 120, there is no possibility that the first device will be inadvertently hit in any way. To the extent that the enclosure of the first device 110 does not fit completely within the enclosure of the second device 120 when the first device 110 is mated to the second device, that portion of the first device that protrudes from the second device is insufficient to represent a substantial probability of being detrimentally harmed (i.e., disconnected from device 120 or damaged) if hit.

In some embodiments, the first device 110 comprises a storage medium such as any suitable form of volatile or non-volatile storage, and the second device 120 comprises an electronic device such as a computer. As a storage device, the first device 110 comprises any one of multiple types of memory transfer cards such as a secure data (SD) memory card, a memory stick (MS) memory card, a compact flash (CF) card having flash memory, or a multimedia card (MMC) card. The second device 120 may comprise any type of computer such as a desktop or rack-mounted computer or any type of portable computer such as notebook computer, laptop computer, tablet computer, hand-held computer, etc. In some embodiments, the second device 120 may comprise a device other than a computer and the first device may comprise a device other than a memory device.

In general, the connectors 112 and 122 of the first and second devices are mating connectors thereby enabling electrical connectivity to be established between the two devices. In some embodiments, the first connector 112 and the second connector 122 comprise mating USB connectors, although the connectors can be implemented in accordance with other types of interfaces. The connectors 112 and 122 and electrical connectivity between devices 110 and 120 may be in accordance with other standards besides USB such as the Institute of Electrical and Electronics Engineers (IEEE) 1394 or Personal Computer Memory Card International Association (PCMCIA) standards.

The aforementioned “first position” refers to the position (shown in FIG. 2A) in which the first connector 112 of the first device 110 is not yet connected with the second connector 122 of the second device 120. The “second position” refers to the position (shown in FIG. 2B) in which the first connector 112 is connected with the second connector 122. As for the positions shown in FIGS. 2C and 2D, the first connector 112 may be connected to, or in touch with, the second connector 122.

Figure 1B:
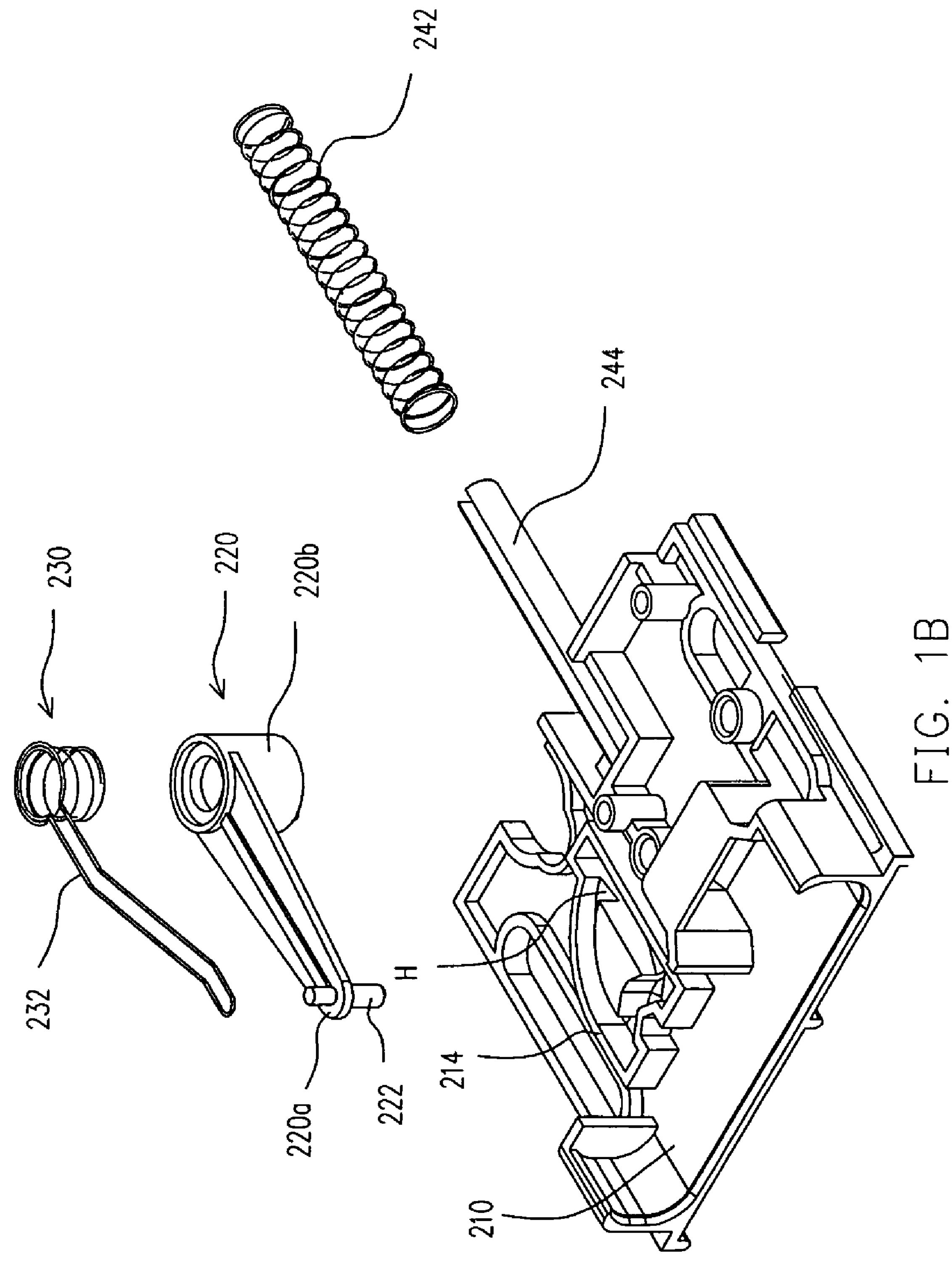
FIG. 1B is an exploded view of embodiments of the invention showing a portion of members of the positioning mechanism of FIG. 1A.

Referring to FIGS. 1A and 1B, the positioning mechanism of the embodiment shown includes a slide base 210, a rotation arm 220, a first elastic member 230, and a second elastic member 240. The slide base 210 is moveably disposed on a bottom surface 124 of the second device 120, and is slidable in a first sliding direction A (i.e., the Y-axis direction) or an opposite, second sliding direction B (i.e., the negative Y-axis direction). The slide base 210 has a track 214 that forms a closed sliding path P (shown in FIG. 2A), which defines a first positioning point M1, a first release point N1, a second positioning point M2, and a second release point N2. The second connector 122 of the second device 120 is disposed on the slide base 210. In addition, the slide base 210 further includes a slide rail 212, which may include a slide bar 212*a* and a guide block 212*b*. The slide bar 212*a* can be disposed on both sides of the slide base 210, and the guide block 212*b* can be fixed on the bottom surface 124, so that the slide base 210 is slidable in a first sliding direction A (i.e., the Y-axis direction) or an opposite, second sliding direction B (i.e., the negative Y-axis direction).

The rotation arm 220 can be divided into a first end 220*a* and a second end 220*b*, wherein the first end 220*a* is disposed on the slide base 124 of the second device 120 and is rotatable around the axis R, and the second end 220*b* has a slide stick 222 (shown in FIG. 1B) capable of being positioned at the first position M1 or the second position M2 on the sliding path P along the track 214. The first elastic member 230 is disposed between the bottom surface 124 and the rotation arm 220. The first elastic member 230, as a spiral spring for example, has an elastic arm 232. Via a torque created from the first elastic member 230, the elastic arm 232 can drive the second end 220*b* of the rotation arm 220 to rotate clockwise (viewed from above) around the rotation axis R, and, at the same time, slant towards the bottom surface 124, i.e., in the negative Z-axis direction.

As shown in FIG. 1A, the second elastic member 240 is disposed between the bottom surface 124 and the slide base 210. The second elastic member 240 includes a hollow spiral spring 242, a guide beam 244 and a limiting portion 246. The limiting portion 246 is connected to the bottom surface 124 of the second device 120, and an end of the guide beam 244 is connected to the slide base 210. The guide beam 244 extends approximately in parallel with the Y-axis (i.e., along the first sliding direction A of the second sliding direction B), and two ends of the hollow spiral spring 242 reaches to the slide base 210 and the limiting portion 246, respectively.

Figure 2A:
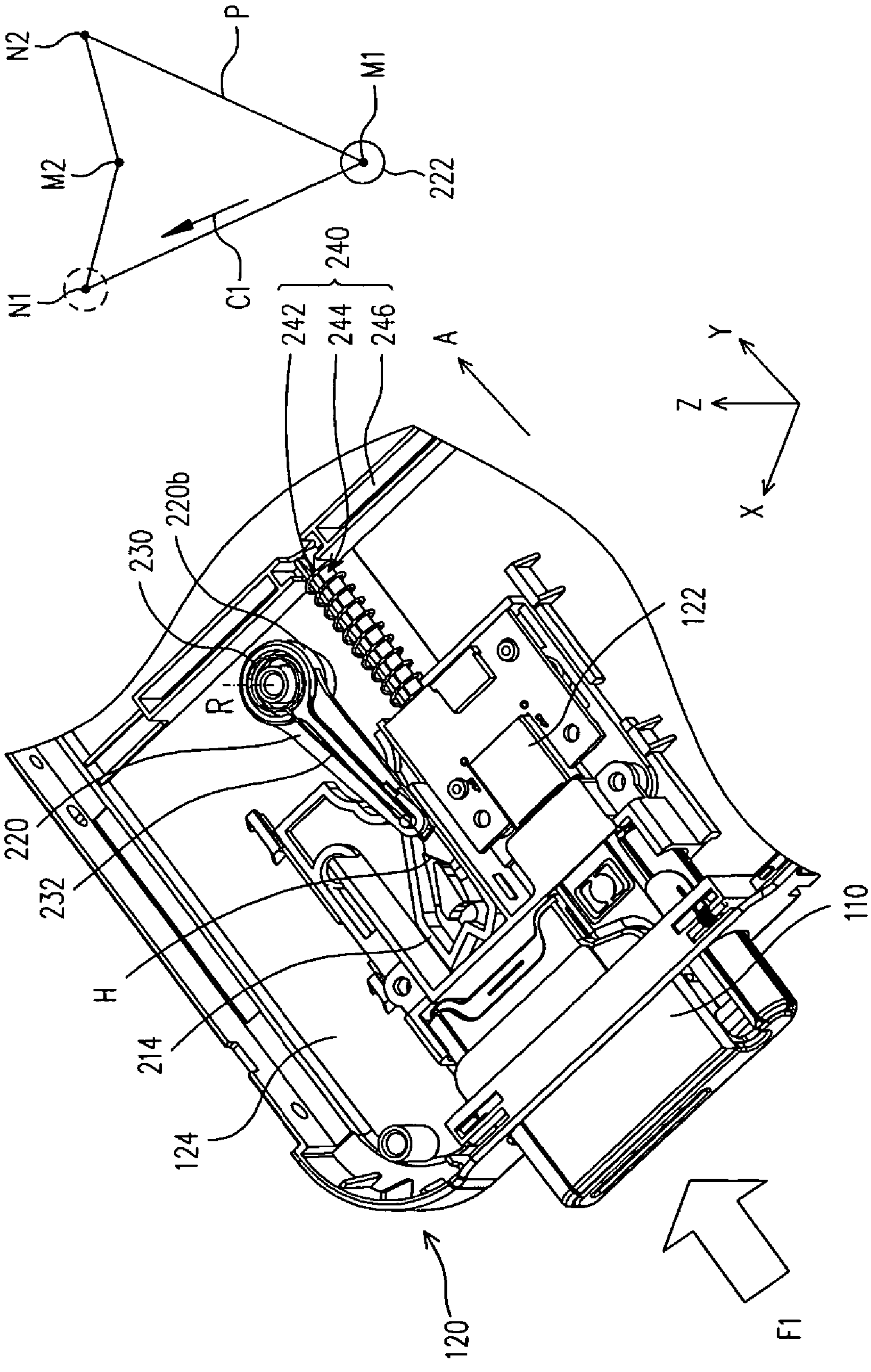
FIGS. 2A-2D are perspective views showing operation of the positioning mechanism of FIG. 1A.
Figure 2B:
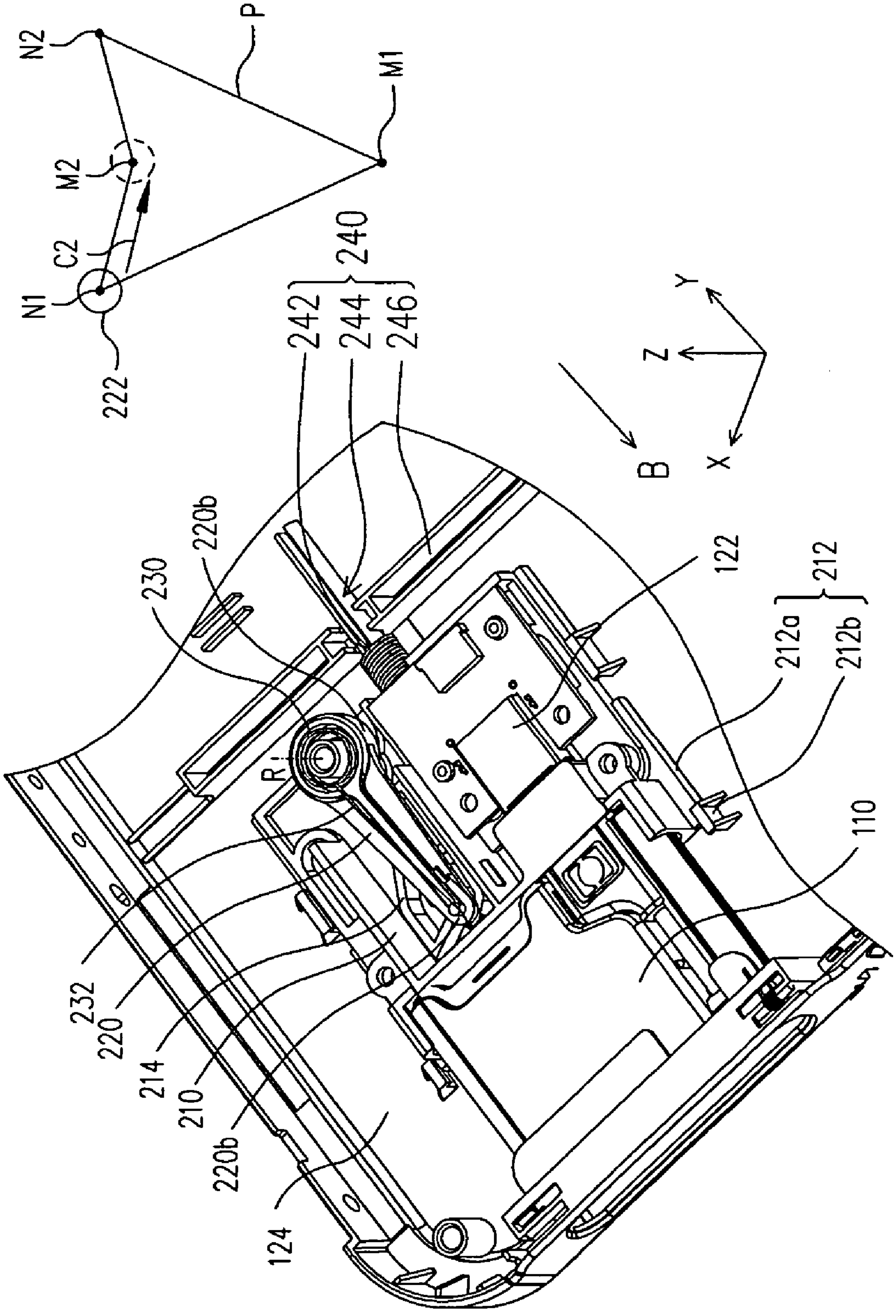

Referring to FIGS. 2A and 2B, when the slide stick 222 stops at the first positioning point M1 on the sliding path P, the first device 110 is positioned at the first position. When the first connector 112 (shown in FIG. 1A) of the first device 110, as a first force F1 is exerted on the first device 110, touches/connects to the second connector 122 from the sliding direction A, and the slide base 210 is brought to slide in the sliding direction A, the first spring member 230 (i.e., the elastic arm 232 of the spiral spring) will continuously drive the second end 220*b* of the rotation arm 220 to rotate clockwise (viewed from above) around the rotation axis R, and, at the same time, slant towards the bottom surface 124, i.e., in the negative Z-axis direction. Correspondingly, the first elastic member 230 (i.e., the elastic arm 232 of the spiral spring) will drive the slide stick 222 to slide from the first positioning point M1 on the sliding path P in a direction C1 to the first release point N1 on the sliding path P.

When the slide stick 222 reaches the first release point N1, the first connector 112 (shown in FIG. 1A) is connected with the second connector 122. If the first force F1 exerted directly on the first device 110 is removed, the second elastic member 240 will drive the slide base 210 to slide in the second sliding direction B, and, at the same time, the first elastic member 230 can continuously drive the second end 220*b* of the rotation arm 220 to rotate clockwise (viewed from above) around the rotation axis R, and, at the same time, slant towards the bottom surface 124, i.e., in the negative Z-axis direction. The first elastic member 230 drives the slide stick 222 to slide from the first release point N1 in the direction C2 until stopping at the second positioning point M2. Here, the second elastic member 240 being compressed reserves potential energy. When the slide stick 222 stops at the second positioning point M2 of the slide trajectory P, the first device 110 is positioned at the second position of the second device 120, as shown in FIG. 2C.

Figure 2C:
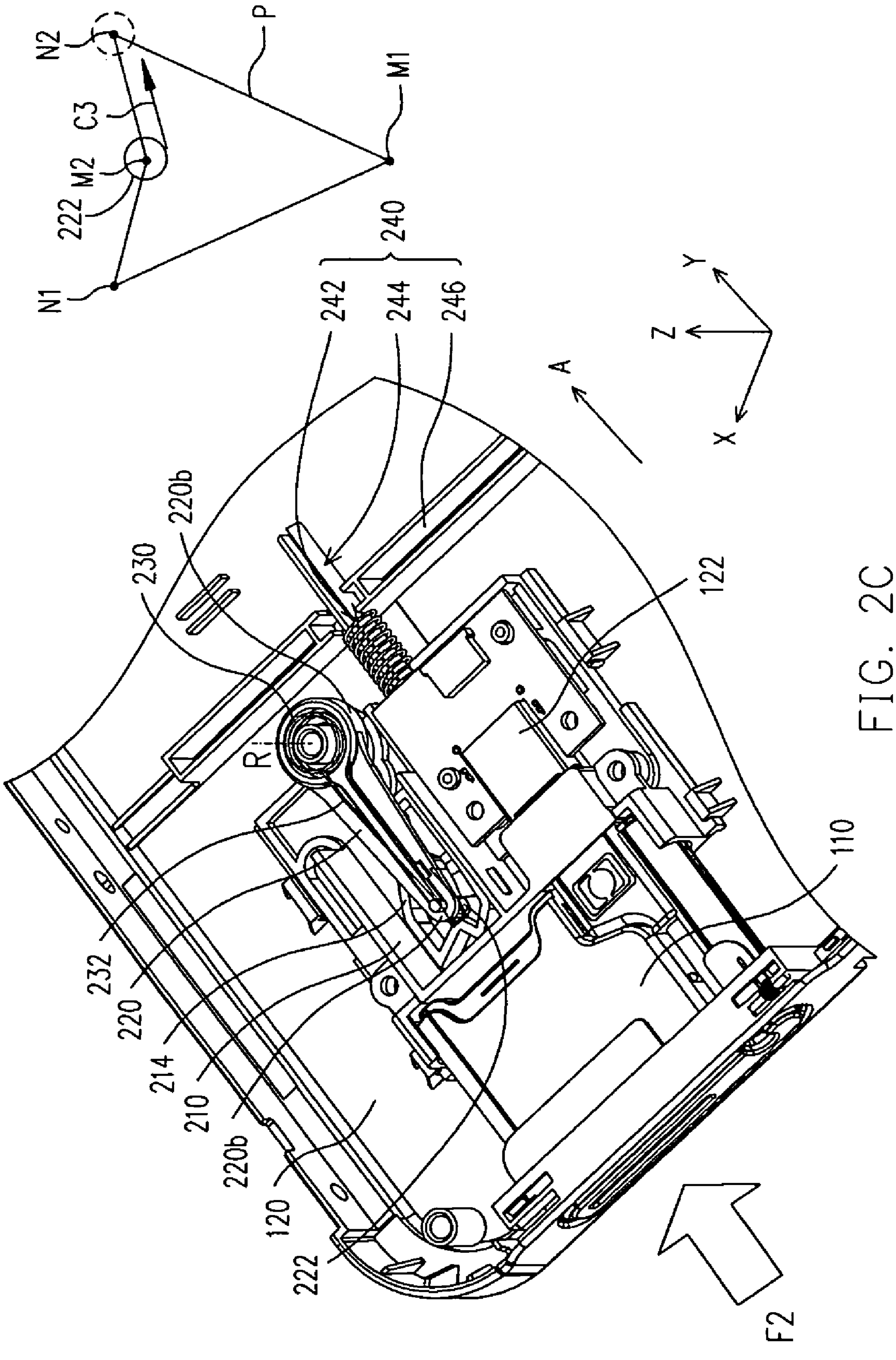
Figure 2D:
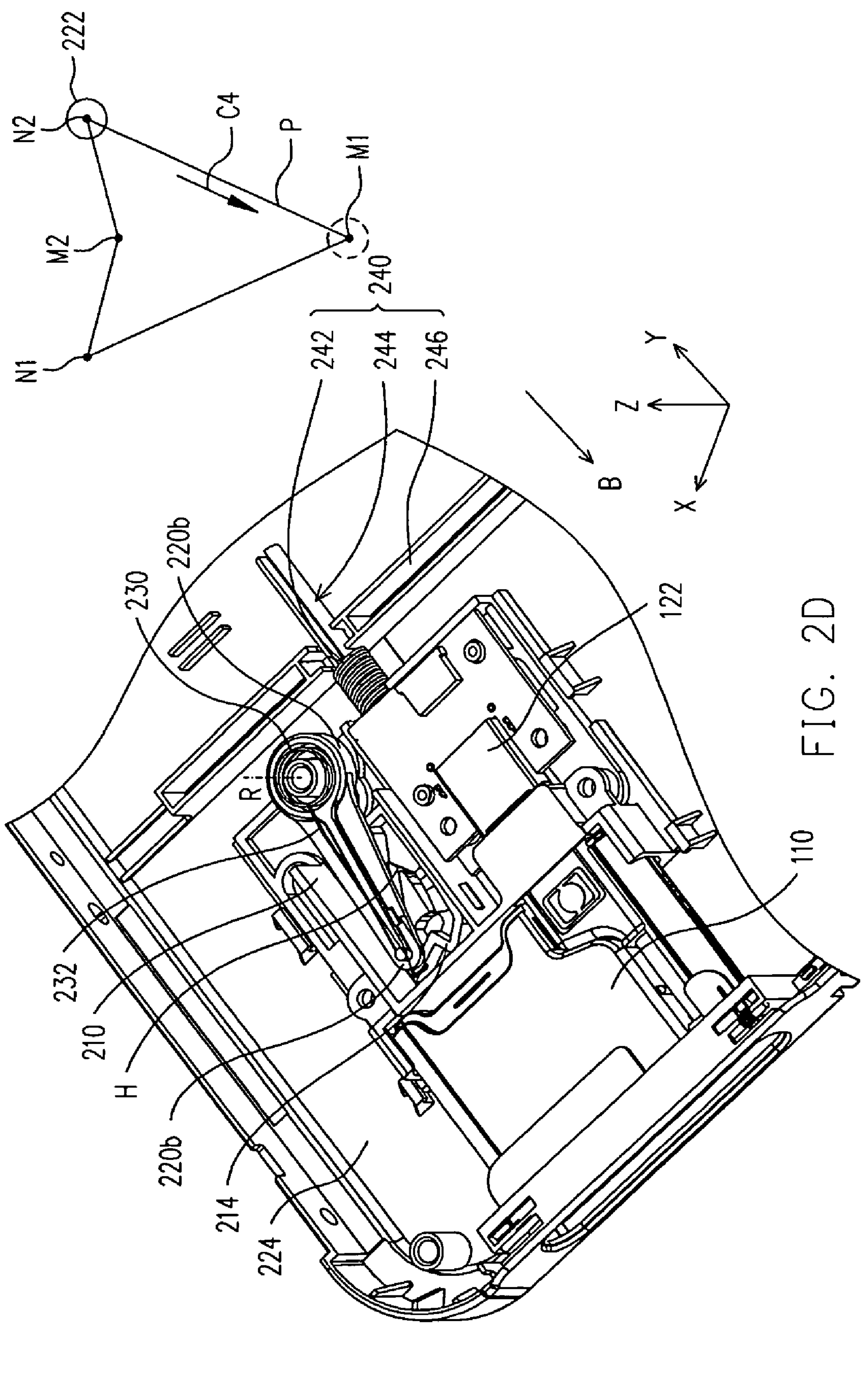

Referring to FIGS. 2C and 2D, when the slide stick 222 stops at the second positioning point M2, the first connector 112 (shown in FIG. 1A) is connected to the second connector 122. If the first connector 112 (shown in FIG. 1A), as a second force F2 is exerted on the first device 110, slides along the first sliding direction A, and drives the slide base 210, via the second connector 122 indirectly, in the first sliding direction A, the hollow spiral spring 242 of the second elastic member 240 will be pressed by the limit portion of the slide base 210. At the same time, the first elastic member 230 (i.e., the elastic arm 232 of the spiral spring) will continuously drive the second end 220*b* of the rotation arm 220 to rotate clockwise (viewed from above) around the rotation axis R, and, at the same time, slant towards the bottom surface 124, i.e., in the negative Z-axis direction. Here, the first elastic arm 230 drives the slide stick 222 to slide from the second positioning point M2 along the direction C3 until reaching the second release point N2 on the sliding path P.

Referring to FIGS. 2A and 2D, when the slide stick 222 reaches the second release point N2 and the second force F2 exerted on the first device 110 is removed, the second elastic member 240 releases potential energy to drive the slide base 210 to slide in the second sliding direction B, and, at the same time, the first elastic member (i.e., the elastic arm 232 of the spiral spring) remains to drive the second end 220*b* of the rotation arm 220 to rotate clockwise (viewed from above) around the rotation axis R, and, at the same time, slant towards the bottom surface 124, i.e., in the negative Z-axis direction. Thus, the first elastic member 230 will drive the slide stick 222 to slide continuously in the direction C4, so as to drive the slide stick 222 back to the first positioning point M1. When the slide stick 222 stops at the first positioning point M1, the first device 110 is positioned at the first position of the second device 110, so that the first and second devices can be disengaged from one another.

A height drop H exists along the sliding path P from the bottom surface at the first positioning point M1 to the bottom surface at the first release point N1. Because of such height drop H, the slide stick 222 can slide in the direction C1 from the first positioning point M1 to the first release point N1, but will not slide in a direction opposite to the direction C4 from the first positioning point M1 to the second release point N2, thereby ensuring proper operation of the positioning mechanism.

The distance between the position of the second device 120 and the position of the enclosure of the first device 110 determines and thus controls the depth in which the enclosure of the first device can be inserted into the enclosure of the second device. Therefore, in the foregoing embodiment, the positioning mechanism is provided within the second device 120 in such a way that the first device 110 is largely or entirely contained within the second device. In some embodiments, however, the positioning mechanism is disposed on the enclosure of the second device 120 in a position such that a portion of the first device is contained within the second device, with the rest of the first device exposed outside of the second device.

It will be apparent to those skilled in the art that various modifications and variations can be made to the embodiments of the present invention without departing from the scope or spirit of the invention. In view of the foregoing, it is intended that the present invention covers modifications and variations of this invention provided they fall within the scope of the following claims and their equivalents.

What is claimed is:

1. A positioning mechanism comprising:

a slide base, disposed over a bottom surface of a second device and slidable in a first sliding direction and an opposite, second sliding direction, wherein the slide base has a track disposed thereon defining a closed sliding path, and the closed sliding path defines a first positioning point, a first release point, a second positioning point, and second release point;

a rotation arm with a first end and a second end, the first end being disposed on the bottom surface of the second device around a pivot, and the second end having a slide member capable of being positioned at the first positioning point or the second positioning point along the sliding path of the track; and an elastic member provided on the bottom surface, said elastic member being configured to cause the second end of the rotation arm to rotate and to cause the slide base to slide;

wherein the slide member of the first end of the rotation arm is caused to move in only one direction along the closed sliding path.

2. The positioning mechanism of claim 1 wherein the elastic member comprises first and second elastic members, said first elastic member disposed between the bottom surface and the rotation arm for driving the second end of the rotation arm to rotate around the pivot, and said second elastic member disposed between the bottom surface and the slide base for driving the slide base to slide in the second sliding direction.

3. The positioning mechanism of claim 1, wherein applying a first force to a first device at a first position causes a first connector of the first device to approach a second connector of the second device along the first sliding direction, causes the slide base to slide in the first sliding direction, and causes the slide member to slide along the closed sliding path until the slide member reaches the first release point on the sliding path so that the first connector connects to the second connector.

4. The positioning mechanism of claim 3, wherein upon discontinuing application of the first force, the elastic member drives the slide member to slide along the closed sliding path until the slide member stops at the second positioning point on the closed sliding path so that the first device is positioned at the second position and at least a portion of the elastic member is compressed to reserve potential energy.

5. The positioning mechanism of claim 4, wherein applying a second force to the first device causes the first connector of the first device to slide in the first sliding direction, causes the second connector and the slide base to slide in the first sliding direction, and causes the elastic member to drive the slide member to slide further along the closed sliding path until the slide member reaches the second release point on the slide path.

6. The positioning mechanism of claim 5, wherein upon discontinuing application of the second force, the elastic member releases the potential energy thereby causing the slide base to slide in the second sliding direction, the elastic member to drive the slide member to slide further along the closed sliding path, and the slide member to slide back to the first position, so that the first device and the second device are capable of being disengaged from one another.

7. The positioning mechanism of claim 1, wherein the slide base further comprises a slide rail disposed between the bottom surface and the slide base for connecting the slide base with the bottom surface wherein the slide base is slidably disposed on the slide rail.

8. The positioning mechanism of claim 1, wherein the elastic member comprises a spiral spring having an elastic arm.

9. The positioning mechanism of claim 1, wherein the track has a difference in height between the first positioning point and the second release point, and, because of such difference in height, the slide member is capable of sliding along the closed sliding path from the first positioning point to the first release point.

10. The positioning mechanism of claim 1, wherein a first device can be inserted into and released from the positioning mechanism by application of a force to the first device without use of separate user-contacted eject member.

11. A positioning mechanism suitable to position a first device at a first position or a second position related to a second device, wherein, as a force is exerted on the first device, a first connector of the first device is driven to connect with a second connector of the second device, the positioning mechanism comprising:

a slide base, disposed over a bottom surface of the second device and slidable in a first sliding direction and an opposite, second sliding direction, wherein the slide base has a track disposed thereon defining a closed sliding path, and the closed sliding path defines a first positioning point, a first release point, a second positioning point, and second release point;

a rotation arm with a first end and a second end, the first end being disposed on the bottom surface of the second device around a pivot, and the second end having a slide stick capable of being positioned at the first positioning point or the second positioning point along the sliding path of the track;

a first elastic member, disposed between the bottom surface and the rotation arm for driving the second end of the rotation arm to rotate around the pivot; and a second elastic member, disposed between the bottom surface and the slide base for driving the slide base to slide in the second sliding direction;

wherein the second elastic member comprises a hollow spiral spring, a guide beam, and a limiting portion, wherein, the limiting portion is connected to the bottom surface of the second device, and the guide beam is connected at an end thereof to the slide base, the hollow spiral spring is disposed around the slide beam, and the hollow spiral spring touches at two ends thereof, respectively, the slide base and the limiting portion.

12. The positioning mechanism according to claim 11, wherein:

when a first force is exerted on the first device at the first position, which drives the first connector of the first device to approach the second connector of the second device along the first sliding direction, and, simultaneously, drives the slide base to slide in the first direction, the slide stick slides along the closed sliding path until the slide stick reaching the first release point on the closed sliding path so that the first connector connects to the second connector;

when the first force is removed, the first elastic member drives the slide stick to slide along the closed sliding path until the slide stick stopping at the second positioning point on the closed sliding path so that the first device is positioned at the second position and the second elastic member is compressed to reserving a potential energy;

when a second force is exerted on the first device, which drives the first connector of the first device to slide in the first sliding direction, and, simultaneously, drives the second connector and the slide base to slide in the first sliding direction, the first elastic member drives the slide stick to slide further along the closed sliding path until the slide stick reaching the second release point on the slide path; and when the second force is removed, the second elastic member releases the potential energy for driving the slide base to slide in the second sliding direction, and the first elastic member drives the slide stick to slide further along the sliding path and to cause the slide stick back to the first position, so that the first device is positioned at the first position and the first device and the second device are capable of being disengaged from one another.

13. The positioning mechanism according to claim 11, wherein the slide base further comprises a slide rail disposed between the bottom surface and the slide base for connecting the slide base with the bottom surface wherein the slide base is slidably disposed on the slide rail.

14. The positioning mechanism according to claim 11, wherein the first elastic member comprises a spiral spring having an elastic arm.

15. The positioning mechanism according to claim 11 wherein the track has a difference in height between the first positioning point and the second release point, and, because of the difference in height, the slide stick is capable of sliding along the closed sliding path from the first positioning point to the first release point.

16. The positioning mechanism according to claim 11, wherein the first device comprises a memory device.

17. The positioning mechanism according to claim 11, wherein the second device is a notebook computer.

18. The positioning mechanism according to claim 11, wherein the first connector and the second connector comprise USB interfaces.

19. A positioning mechanism suitable to position a first device at a first position or a second position related to a second device, wherein, as a force is exerted on the first device, a first connector of the first device is driven to connect with a second connector of the second device, the positioning mechanism comprising:

a slide base, disposed over a bottom surface of the second device and slidable in a first sliding direction and an opposite, second sliding direction, wherein the slide base has a track disposed thereon defining a closed sliding path, and the closed sliding path defines a first positioning point and second positioning point;

a rotation arm with a first end and a second end, the first end being disposed on the bottom surface of the second device around a pivot, and the second end having a slide stick suitable to slide on the track;

a first elastic member, disposed between the bottom surface and the rotation arm for driving the second end of the rotation arm to rotate around the pivot, and driving the rotation arm to slant at the second end towards the bottom surface; and a second elastic member, disposed between the bottom surface and the slide base for driving the slide base to slide in the second sliding direction.

20. The positioning mechanism according to claim 19, wherein:

when the slide base is forced to slide in the first sliding direction until stopping at the first positioning position, the first device is positioned at the first position related to the second device; and when the slide base is forced to slide in the first sliding direction until stopping at the second positioning position, the first device is positioned at the second position related to the second device.

21. A positioning mechanism, comprising:

means for sliding in a first sliding direction and an opposite, second sliding direction;

means for defining a closed sliding path that comprises a first positioning point, a first release point, a second positioning point, and second release point;

means for rotating;

a first elastic means for driving the means for rotating to rotate around a pivot; and a second elastic means for driving the means for sliding in the second sliding direction.

* * * * *